United States Patent
Brennan et al.

(10) Patent No.: US 7,210,085 B2
(45) Date of Patent: Apr. 24, 2007

(54) METHOD AND APPARATUS FOR TEST AND REPAIR OF MARGINALLY FUNCTIONAL SRAM CELLS

(75) Inventors: Ciaran J. Brennan, Essex Junction, VT (US); Steven M. Eustis, Essex Junction, VT (US); Michael T. Fragano, Essex Junction, VT (US); Michael R. Ouellette, Westford, VT (US); Neelesh G. Pai, Williston, VT (US); Jeremy P. Rowland, Essex Junction, VT (US); Kevin M. Tompsett, Summit, NJ (US); David J. Wager, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 10/725,668

(22) Filed: Dec. 2, 2003

(65) Prior Publication Data
US 2005/0138496 A1 Jun. 23, 2005

(51) Int. Cl.
*G01R 31/28* (2006.01)
(52) U.S. Cl. .................. 714/733; 714/710; 714/25; 714/718; 714/734; 714/736; 714/745; 365/201
(58) Field of Classification Search .................. None
See application file for complete search history.

(56) References Cited

U.S. PATENT DOCUMENTS

| | | | |
|---|---|---|---|
| 5,909,404 A | 6/1999 | Schwartz | |
| 5,987,632 A | 11/1999 | Irrinki et al. | |
| 6,067,262 A | 5/2000 | Irrinki et al. | |
| 6,085,334 A * | 7/2000 | Giles et al. | 714/7 |
| 6,246,617 B1 | 6/2001 | Urakawa | |
| 6,246,618 B1 | 6/2001 | Yamamoto et al. | |
| 6,343,366 B1 | 1/2002 | Okitaka | |
| 6,496,947 B1 * | 12/2002 | Schwarz | 714/30 |
| 6,504,772 B2 * | 1/2003 | Maeno | 365/201 |
| 6,560,740 B1 * | 5/2003 | Zuraski et al. | 714/733 |
| 6,651,202 B1 * | 11/2003 | Phan | 714/733 |
| 6,691,264 B2 * | 2/2004 | Huang | 714/723 |
| 6,718,496 B1 * | 4/2004 | Fukuhisa et al. | 714/733 |
| 6,973,605 B1 * | 12/2005 | Templeton et al. | 714/718 |
| 2004/0062095 A1 * | 4/2004 | Templeton et al. | 365/200 |

FOREIGN PATENT DOCUMENTS

WO    WO 02/103522    12/2002

\* cited by examiner

*Primary Examiner*—Albert Decady
*Assistant Examiner*—John P. Trimmings
(74) *Attorney, Agent, or Firm*—RatnerPrestia

(57) ABSTRACT

A method of manufacturing a device having embedded memory including a plurality of memory cells. During manufacturing test, a first test stress is applied to selected cells of the plurality of memory cells with a built-in self test. At least one weak memory cell is identified. The at least one weak memory cell is repaired. A second test stress is applied to the selected cells and the repaired cells with the built-in self test.

22 Claims, 3 Drawing Sheets

METHOD AND APPARATUS FOR TEST AND REPAIR OF MARGINALLY FUNCTIONAL SRAM CELLS

TECHNICAL FIELD

The present invention relates generally to the repair of memory cells used in computer chips and, more particularly, to the repair of embedded memory such as static random access memory (SRAM) cells.

BACKGROUND OF THE INVENTION

An application-specific integrated circuit or "ASIC" is an integrated circuit ("IC") designed to perform a particular function by defining the interconnection of a set of basic circuit building blocks drawn from a library provided by the circuit manufacturer. An ASIC is an IC with functionality customized for a particular use, such as particular equipment or a particular project, rather than being for general-purpose use. For example, a chip designed solely to run a cash register is an ASIC. In contrast, a microprocessor is not application specific because it can be adapted to many purposes.

An "embedded system" is a special-purpose computer system built into a larger device. An embedded system is typically required to meet very different requirements than a general-purpose personal computer. Nearly all companies use embedded memory. Because many embedded systems are produced in the tens of thousands to millions of units range, reducing cost is a major concern. Embedded systems often use a relatively slow processor and small memory size to minimize costs.

Nearly all ASIC chips contain "static random access memory" or "SRAM" as embedded memory. SRAM is a type of semiconductor memory. Random access indicates that locations in the memory can be accessed, i.e., written or read, in any order regardless of the memory location that was previously accessed. A SRAM cell involves random access memory in which each bit of storage is a bi-stable flip-flop, commonly consisting of cross-coupled inverters. The memory cell is called "static" because it will retain a value as long as power is supplied, unlike dynamic random access memory or "DRAM," which must be regularly refreshed. Nevertheless, a SRAM cell is still volatile: it will lose its contents when the power is switched off (in contrast to a read-only memory or "ROM" cell). SRAM is usually faster than DRAM. It is used for the parts of a computer that require highest speed, such as cache memory.

Some memory cells, including SRAM cells, may be marginally functional. They might pass initial testing, but then fail in the field under normal operating conditions which are slightly different from the conditions that are present during the initial testing. Even if cells are tested at operational speed, there might be a cell that is right on the edge of failure and can fail in the field after it is shipped to the customer and while the customer is using it in the customer's application. When SRAM cells fail in the field, the failure creates a "shipped product quality level" or SPQL problem. If the SPQL number gets too high, the customers are dissatisfied. Even though the supplier of the memory cells can give the customer a new part, the customer may have experienced unnecessary delays. SPQL is becoming more and more important in embedded memory.

Although IC manufacturers strive to make chips with minimum defects, as a practical matter defects still occur for various reasons. For example, particles of dust may settle on the surface of a silicon wafer during processing. Embedded memories are increasingly susceptible to such defects as the density and quantity of memory on ICs increases. The impact of a defect within the embedded memories on overall yield, or the ratio of acceptable to unacceptable total components, has also increased significantly. Because a single defect in a single memory cell can render the whole IC unusable, techniques to test for such defects and repair them by using extra storage cells have been implemented. These techniques seek to improve the overall yield and, therefore, reduce the cost of the IC.

Conventional test and repair techniques are known. For example, U.S. Pat. No. 6,246,618 issued to Yamamoto et al. discloses test-repair control logic for choosing a random access memory or "RAM" test and repair mode and for choosing an ordinary mode for carrying out ordinary operations. The control logic tests multiple RAMs on a chip and replaces bad RAMs as a whole.

A built-in self test or "BIST" is a technique of designing circuits with additional logic which can be used to test proper operation of the primary (functional) logic. U.S. Pat. No. 6,343,366 issued to Okitaka discloses selectors for changing data paths during a normal operating mode and a test operating mode. A BIST circuit built in a LSI SRAM device and a self repair circuit are also disclosed. This patent teaches a basic BIST.

Various devices and methods to test memory cells have been developed. But testing to identify problem cells is only a first step. Once identified, the problem cells must be repaired. A built-in self repair or "BISR" is a technique of designing circuits with additional logic which can be used to repair the operation of the primary logic. Conventional BIST and BISR techniques are known.

U.S. Pat. No. 6,560,740 issued to Zuraski, Jr. et al. discloses an apparatus and method for BIST and BISR of an embedded memory formed of random logic on a semiconductor substrate. A control signal determines the operating mode during testing. Input and output signals are used during normal operation. The patent shows a simple BIST that does not have the flexibility to test the memory in a harder or easier manner.

U.S. Pat. No. 6,496,947 issued to Schwarz discloses BIST and BISR operations for testing and repairing of weak, leaky, or faulty SRAM cells. During normal operation, the test input is inactive and external address inputs are used to access selected memory locations. Disclosed are two modes, a factory mode and a field mode (basically test and customer). Schwarz addresses a particular type of fail called a retention fail. The system adds an extra test in the factory that takes longer to find these fails. It weeds out retention failures with a pause in the testing. If the testing procedure waits long enough (for example, two or three milliseconds), thereby inserting a pause, the system will find a fail. When the customer receives the SRAM, the customer does not have the extra delay. This system tests the system in a slower condition than the customer's operational mode.

U.S. Pat. No. 6,246,617 issued to Urakawa discloses a test process for a large scale integrated ("LSI") SRAM including a redundant circuit for BIST and BISR methods. After the test and repair, a reading circuit chooses between a proper memory array and a redundancy program array during a normal read operation. The patent shows a basic BIST and repair.

U.S. Pat. No. 6,085,334 issued to Giles et al. discloses a method of testing an array of SRAM cells for defects which are sensitive to environmental conditions. A BIST is used for the testing and a BISR is used for replacing failed memory locations with spare memory elements. Normal operation through an interface is also disclosed. The patent shows a basic BIST and discusses tests under several environmental conditions or corners.

U.S. Pat. No. 6,067,262 issued to Irrinki et al. discloses a methodology for screening out field errors at the factory using BIST and BISR circuitry. A "march" test and a "neighbor pattern sensitive" test are used on SRAMs. The circuitry includes data bus signals during normal operation. The patent shows a basic BIST and also discusses tests under several environmental conditions.

U.S. Pat. No. 5,987,632 issued to Irrinki et al. discloses performing a BIST to detect marginal memory cells at degraded conditions after each power-up in the field. A BISR replaces a failing cell with a spare row or column. After testing is complete, normal operation is commenced. No SRAM is disclosed. The BIST runs at various corners.

U.S. Pat. No. 5,909,404 issued to Schwarz discloses applying BIST and BISR to DRAMs rather than SRAMs due to the higher storage capacity of DRAMs. After testing is complete, normal read is performed. The patent shows a BIST that looks for retention fails.

WO 02/103,522 was published on behalf of Templeton and discloses an embedded memory device. Both BIST and BISR are performed on memory cells which are detected as being weak once the operating conditions change from the normal operation by increasing the duration of the read or write. A BIST runs with a stress clock and a BISR is used during each power-up of the memory device. Thus, a testing algorithm runs every time the power is turned on. When the customer turns on the power, the system runs through the algorithm and both tests and repairs itself. But the customer has to wait every time the system is powered up for the entire sequence to complete.

To overcome the shortcomings of memory cell failures, specifically SRAM failures, in the field and to obtain lower SPQL levels, a new method and apparatus of testing SRAM cells is provided. An object of the present invention is to provide an improved method of testing memory cells, including SRAM cells, during the manufacturing process to eliminate defective cells and cells that might fail in the field. A related object is to improve and raise SPQL levels by decreasing the number of memory cells, including SRAM cells, that fail in the field under normal operating conditions when they are in use by the customer.

SUMMARY OF THE INVENTION

To achieve these and other objects and in view of its purposes, the present invention provides a method of manufacturing a device having embedded memory including a plurality of memory cells. A first test stress is applied to selected cells of the plurality of memory cells with a built-in self test. At least one weak memory cell is identified. The at least one weak memory cell is repaired. A second test stress that is less than the first test stress is applied to the selected cells and the repaired cells with the built-in self test.

The present invention also provides a device for testing an embedded memory having a plurality of memory cells. The testing is run during manufacture of the device. The device has a first timer for applying a plurality of timings to the memory cells. The device has a second timer for modifying at least one of the plurality of timings. It also has a logic circuit for testing the memory cells by applying the at least one of the plurality of timings to the memory cells.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
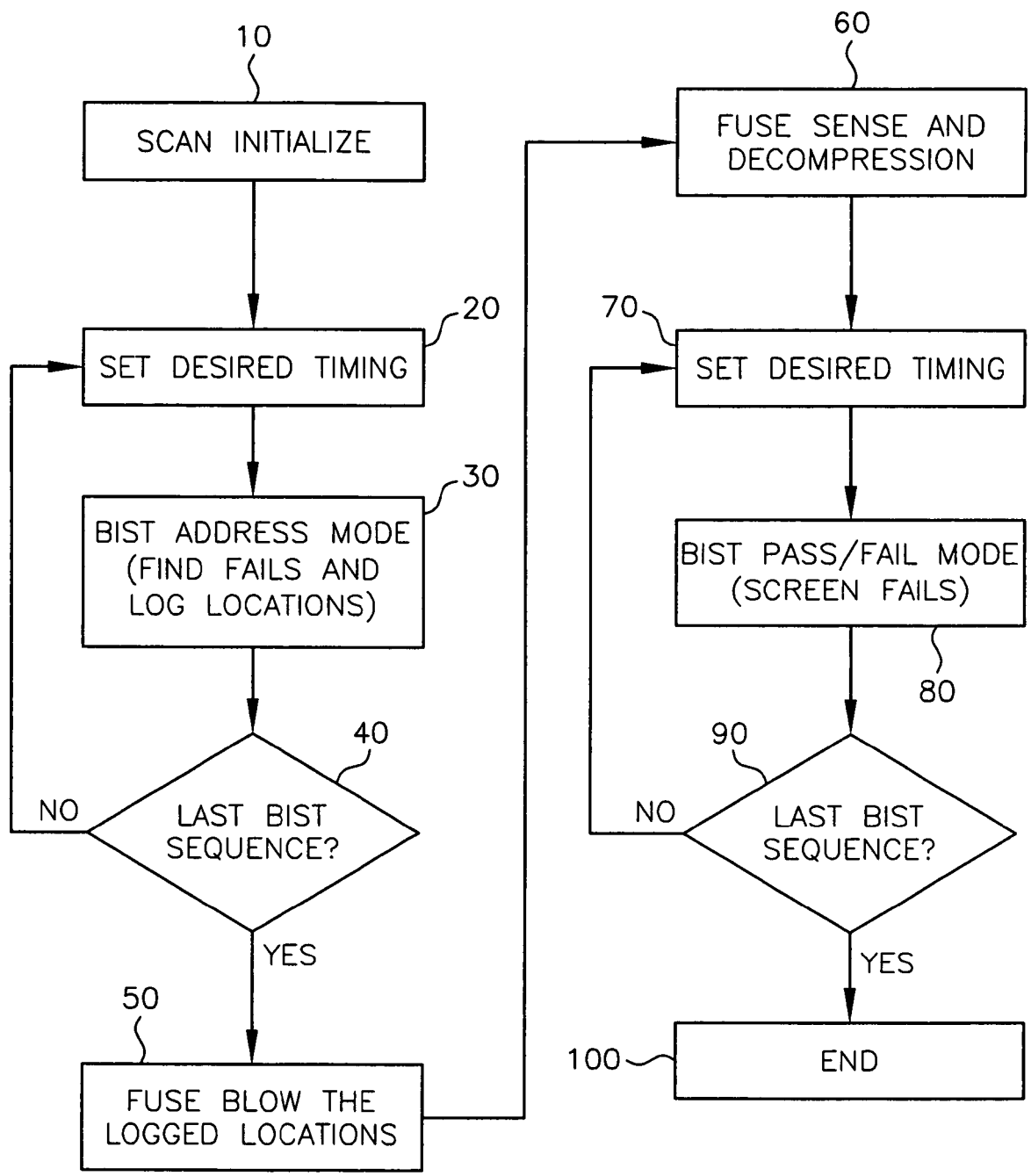
FIG. 1 is a flow chart showing a method for performing the method for testing SRAM cells according to the present invention.

Most memory arrays, including embedded memory cells such as SRAM cells, have redundancy. That is, the cells have extra cells built into the memory array. If there are faulty cells, the faulty cells can be replaced with redundant cells. The inventors have devised a method of using the built-in self-test to identify weak memory cells, including embedded memory cells such as SRAMs, and to repair them before they are sent to a customer. The repairs are completed by using the built-in redundancy.

The invention tests the cells at a stress level that is a little harder than the cells would experience in the field under operational conditions run by the customer. Harder testing can be accomplished, for example, by running the cells with a tighter timing than the timing that would be used by the customer under operational conditions. In alternative embodiments, the memory cells may be tested at a higher frequency, or a higher voltage, or a higher temperature, or other harsher environmental conditions than would be applied by the purchasing customer in the field. In yet other alternative embodiments, the memory cells may be tested using a combination of two or more harder conditions. For example, the memory cells may be tested under higher voltage conditions along with harsher timing conditions.

The purpose of testing the memory cells under tighter timing conditions is to force the memory cells to process information more quickly. For example, but without limiting the invention, during testing, a memory cell might be instructed to process information in 9.9 nanoseconds, or in 9.8 nanoseconds, instead of an operational or functional timing of 10.0 nanoseconds. Alternatively, the harder test can be defined in terms of a percentage difference from the operational mode. That is, the invention may supply a plurality of test stresses, each of which is a higher percentage of the operational stress. For example, but without limiting the invention, one of the test stresses may be 1% tighter than the operational stress; another test stress may be 2% tighter; and a third test stress may be 3% tighter. If the tested memory cell is weak and on the edge of failure, testing it with one or more of these harder test stresses (or another test stress) may fail a weak cell. Then, the weak cell may be replaced before it is sent to a customer. In addition, by choosing the level of stress to apply to the memory cell during the manufacturing process, the manufacturer may obtain a desired SPQL improvement. For example, testing at a 3% tighter level may provide a better SPQL than testing at a 1% tighter level.

In short, by testing memory cells in a harder mode with, for example, a tighter timing, the invention may identify all cells that are close to failing and push them to fail. Then, the cells may be repaired before the SRAM is sent to a customer. When the customer uses the SRAM with the repaired cells in the field in an operational mode, there may not be any weak cells remaining.

The invention may use a BIST that is built into the same ASIC as the memory, or SRAM. In an alternative embodiment, the BIST may be built into the memory, or SRAM. The BIST may be used to test many memory components or SRAMs.

Referring now to the drawings, FIG. 1 is a flow chart showing a method for testing memory cells, including SRAM cells, according to the present invention. The testing may be performed as part of the manufacturing process, before the memory cells are shipped to a customer for use in the field. In discussing the invention, reference will be made to a SRAM. It will be understood by those skilled in the art, however, that the invention may be used to test any type of compilable memory elements, such as a RAM. In the first step 10, power is applied to the SRAM so that the elements of the SRAM are all set to their initial values.

In the second step 20, the desired test timing is set. At this step, eight different timings may be available to test a particular SRAM. From those eight possible timings, the system uses a register to select and set a desired first timing, or first stress, at which to operate the SRAM. The selection is made based upon characterization work that may be performed prior to the manufacturing mode. The selection may be based, for example, on a balance between a desired SPQL and a desired yield. That is, the selection may be based upon the amount of failures the manufacturer wants to tolerate on the SPQL side. Accordingly, if the manufacturer wants to have a fewer amount of failures in its shipped products, it may set the percentage tighten timing at a higher level.

In a preferred embodiment, the desired first test timing may have been determined and selected prior to the beginning of testing. As discussed above, there are a plurality of test timings or test stresses that are available for application to the SRAM. For example, one such timing or stress may be 1% higher than the timing or stress to be used during an operational or functional mode in the field. Accordingly, it may have been determined to apply a first stress timing (also called a tighten timing) that increases the timings applied to the SRAM by 1%, by 2%, or by some other percentage. The determination may be influenced in part by balancing a desire for increased SPQL versus a desire to increase the yield; that is, the percentage of parts that are actually shipped to the customer versus the actual number of manufactured parts. In an alternative embodiment, step 20 may include an additional step of determining the desired tighten timing that is to be applied to the SRAM.

Step 30 shows that the desired tighter timing may be used to test selected cells by using a BIST to apply the tighter timing to selected cells. That is, as shown in step 30, the BIST applies the set tighter timing to selected cells of the plurality of memory cells in the SRAM and to selected addresses in the memory cells. This tighter timing is a first timing. It applies a first stress to the cells. In this step, the BIST tests the memory cells with the set timing, and determines and locates memory cells that fail. The BIST also logs the location of each failed memory cell and the location of each replacement cell for future reference.

The BIST may run each set first timing stress on the selected memory cells in a plurality of BIST sequences; that is, the BIST may run each first set timing stress using different test patterns and/or different conditions that may be selected from a plurality of test sequences. Examples of such plurality of different sequences may be a blanket read pattern, a checker board pattern, a high temperature-low voltage pattern, a low temperature-high voltage pattern, and different environmental conditions. In a conservative testing pattern, only one sequence may be run. If more testing is desired, any number of different sequences might be run. These examples are included to more clearly demonstrate the overall nature of the invention. These examples are exemplary, not restrictive, of the invention. If, for example, the set timing is 1% faster, the BIST may run a blanket read pattern with a 1% faster timing and then the other, different, sequences may also be run with the 1% faster timing, such as, for example, different environmental conditions or low voltage-high temperature. Thus, the 1% faster timing (or whatever timing may be selected and set) may be used by the BIST under several different types of conditions.

The next step 40 allows the BIST to run selected sequences. If the last BIST sequence has not been run, the method returns to step 20, to the first set timing stress, and applies that timing to the selected memory cells of the SRAM using a new sequence. The BIST may continue to run the selected different sequences until all of the selected sequences have been run using the set desired timing. When the last sequence has been run, as shown by the "YES" arrow from step 40, the next step 50 blows the fuses for the faulty cells that have been identified and logged. As part of step 50, the process blows the fuses at the location of each faulty cell and implements the redundancy characteristics of the SRAM to repair the faulty cell by replacing it with a good, redundant memory cell. This step therefore repairs failed memory cells by replacing them with redundant memory cells. The replacement cells may therefore be referred to as the repaired cells and step 50 is the repair step.

After the faulty cells have been replaced, the method in step 60 proceeds to sense the location of the blown fuses that have been implemented. This step also senses where the new word or bit lines are located. It is necessary to locate the new word or bit lines as part of implementing the redundancy. Consequently, the new word or bit lines may be tested in the next series of steps.

In step 70, a pre-selected second timing or second test stress may be set. In an exemplary embodiment, this second test stress may be an operational timing; that is, it may be the timing for a customer mode at which the customer may run the SRAM in the field. In an alternative embodiment, the second timing, or second stress, may be run in a mode that is different than a customer mode under the customer's operational conditions. This second test stress may be applied to the memory cells of the SRAM to make sure that the SRAM will operate under operational conditions without a failure by the selected memory cells and by the repaired cells.

After the operational timing is set, step 80 shows that the BIST may run the second or operational timing in a second plurality of test sequences. The second plurality of test sequences may be the same as the first plurality of test sequences; or the second plurality of test sequences may be different from the first plurality of test sequences; or the second plurality of test sequences may be a subset of the first plurality; or the second plurality may combine a subset of the first plurality with other sequences. In another embodiment, the sequences may include sequences that a customer may use in the field. The purpose of step 80 may be to find cells that fail and to screen out the failed cells by removing them from the manufacturing process before they are shipped to the customer. The only purpose of this step 80 may be to pass or fail cells. It may not be used to further repair cells. Accordingly, as each sequence is run, the BIST identifies, or screens, memory cells that fail. If a memory cell is faulty and fails during the BIST run in step 80, no further steps may be taken to repair the faulty cell. Instead, the SRAM may be rejected and may not be shipped to the customer, thereby improving the SPQL.

Until the last sequence has been run, the method in step 90 will return to step 70. When the last sequence has been run, as indicated by the "Yes" arrow from step 90, the method has been completed as shown in step 100.

Figure 2:
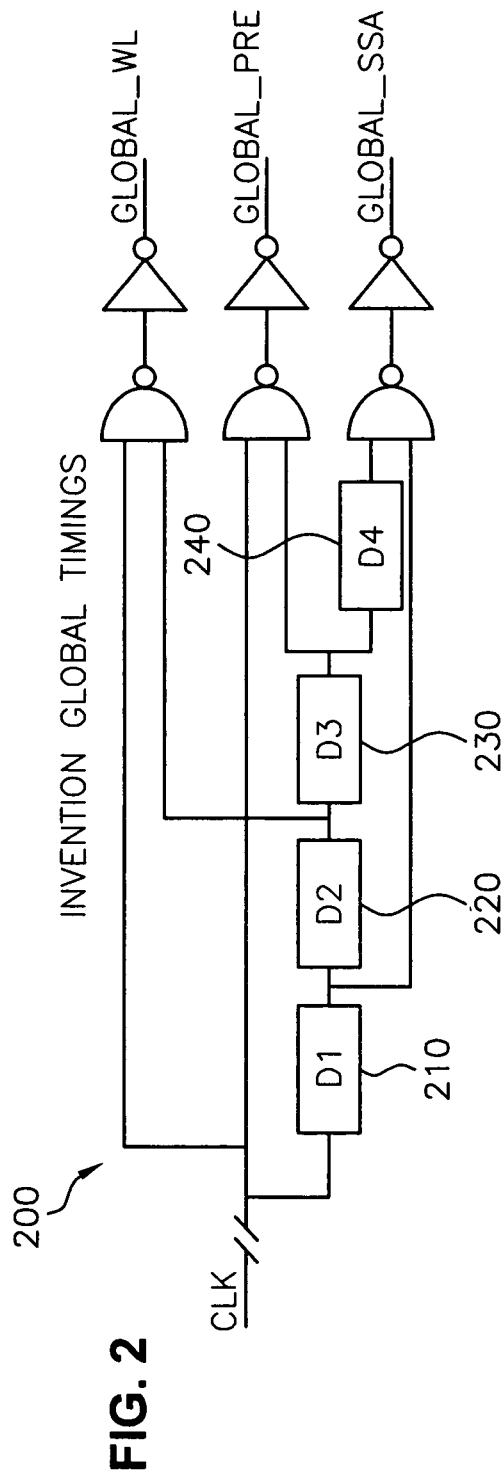
FIG. 2 is an exemplary embodiment of an implementation of the method illustrated in FIG. 1.
Figure 3:
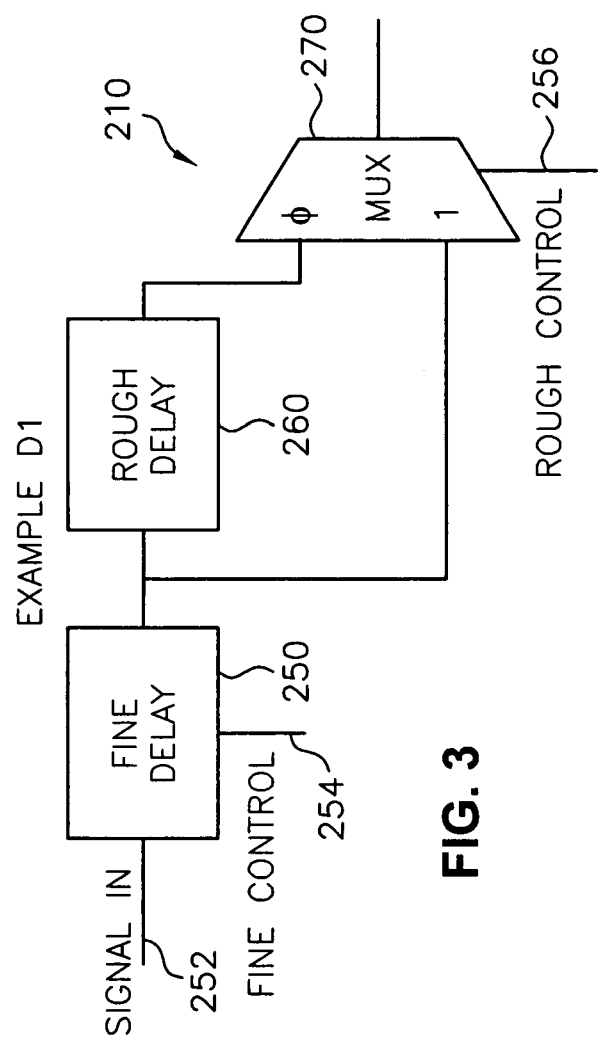
FIG. 3 is an exemplary embodiment of delay D1 illustrated in FIG. 2.

FIGS. 2 and 3 show an exemplary embodiment of the structure used to implement the method of the present invention. FIG. 2 shows the main timing area of the SRAM. That is, it shows the main SRAM architecture 200 to apply global timings. Architecture 200 is a first timer that may apply a plurality of timings to the memory cells. Referring to FIG. 2, first signal GLOBAL_WL controls the wordline turn on/off and receives input directly from the clock CLK. Second signal GLOBAL_PRE controls the pre-charge circuitry. Third signal GLOBAL_SSA controls the timing of the sense amplifier. A second timer 210 controls the delay D1 from wordline turn-on to sense amp sense. Other timers 220, 230, and 240 control the delays D2, D3, and D4, respectively, and control when the three signals GLOBAL_WL, GLOBAL_PRE, and GLOBAL_SSA turn off.

After the wordline is turned on, there is a short wait. Then, the sense amplifier is set. The signal provided by timer 210 sets the amount of set waiting time for the SRAM to respond. It is the variability in D1 which allows the system to test the SRAM harder or easier. Accordingly, timer 210 may modify at least one of the plurality of timings.

Referring to FIG. 3, there is an exemplary embodiment highlighting timer 210 used to change the delay D1. FIG. 3 shows an exemplary embodiment of delay D1 illustrated in FIG. 2. Timer 210 contains two types of delay elements, fine delay 250 and rough delay 260. The rough delay 260 is used to implement the very slow mode. The fine delay 250 is used to vary the delay so that one or more of the functional, three tightened, and three relaxed timings may be implemented. For example, the fine delay 250 provides a device which may be used to speed up the clock signal to the SRAM thereby causing the GLOBAL_SSA signal to occur earlier, thereby providing a tighter timing. The fine delay 250 may also be used to cause the GLOBAL_SSA signal to occur later, thereby providing a relaxed timing.

The fine control and the rough control come from the same BIST. A clock signal is transmitted into the system along the line 252 and passes through the fine delay 250 and the rough delay 260. A fine control signal is transmitted to fine delay 250 along the line 254 when a fine delay is required. A rough delay control signal is transmitted to a multiplexer 270 along the line 256. The fine delay 250, if any, and the rough delay 260 are transmitted to multiplexer 270 which provides an output signal responsive to fine delay 250 and rough delay 260.

Figure 4:
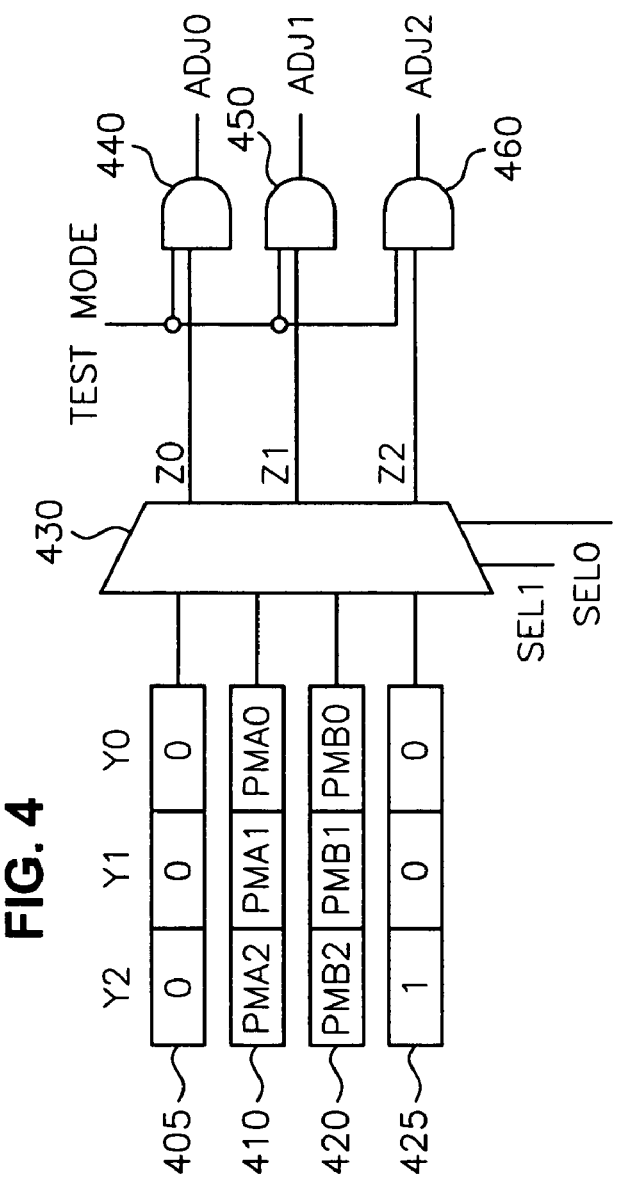
FIG. 4 is an exemplary embodiment of an apparatus that implements the BIST logic used in the method illustrated in FIGS. 1 and 5.
Figure 5:
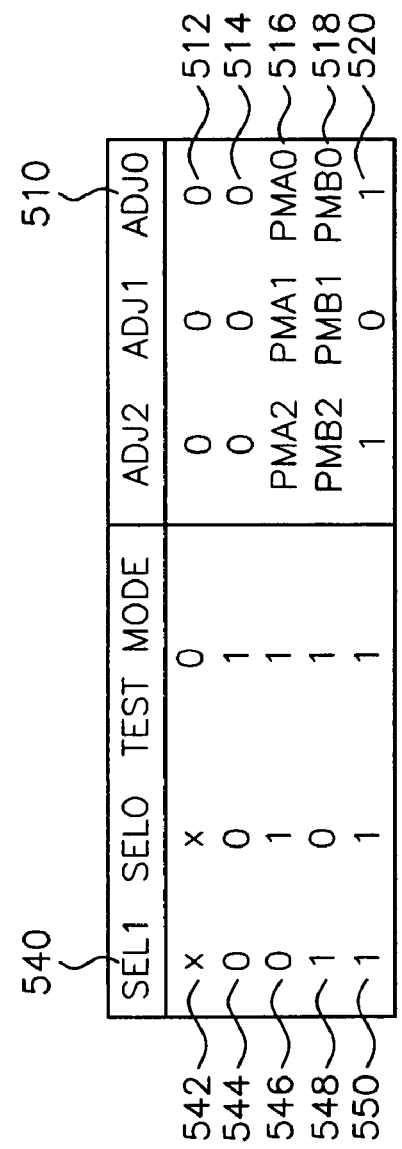
FIG. 5 is an exemplary embodiment of the BIST logic used to implement the method illustrated in FIG. 1.

FIG. 5 is an exemplary embodiment of BIST logic that may be used according to the present invention. FIG. 4 is an exemplary embodiment of an apparatus that implements the BIST logic. If the logic in FIG. 4 is not in "Test Mode," the functional timing is chosen. If the logic is in the "Test Mode," then the combination of SEL0 and SEL1 selects one of four timings with multiplexer 430 which then provides output signals to the AND gates 440, 450, and 460. Registers 405, 410, 420, and 425 shown in FIG. 4 represent four timings. Registers 410, 420 are scan loaded with one of the three tighten timings and one of the three relaxed timings. Register 405 is hard coded to zero, zero, and zero which represents the functional timing. Register 425 is hard coded to one, zero, and zero which represents the very slow mode. When a particular register is chosen with SEL0 and SEL1, the Y0 bit flows to the Z0 output of the multiplexor 430 into AND gate 440, the Y1 bit flows to the Z1 output of the multiplexor 430 into AND gate 450, and the Y2 bit flows to the Z2 output of the multiplexor 430 into AND gate 460. The selected tighten timing and the selected relaxed timing can be different for each SRAM or SRAM family. The ADJ2, ADJ1, and ADJ0 signals are decoded by each SRAM to create the fine control 254 and rough control 256 as shown in FIG. 3.

When the system is not in the test mode as shown in line 542 of block 540 of FIG. 5, there will be all zeros in ADJ2, ADJ1, and ADJ0, which is defined as the customer or functional mode. This arrangement is shown in the line 512 of block 510 in FIG. 5. When the system is in the test mode and SEL1 is zero and SEL0 is zero as shown in line 544 of block 540, the system also operates in customer mode with ADJ2, ADJ1, and ADJ0 defined by register 405 and shown in line 514 of block 510. When the system is in the test mode and SEL1 is zero and SEL0 is one as shown in line 546 of block 540, the system operates in one of the three relaxed modes with ADJ2, ADJ1, and ADJ0 defined by register 410 and shown in line 516 of block 510. When the system is in the the test mode and SEL1 is one and SEL0 is zero as shown in line 548 of block 540, the system operates in one of the three tightened modes with ADJ2, ADJ1, and ADJ0 defined by register 420 and shown in line 518 of block 510. When the system is in the test mode and SEL1 is one and SEL0 is one as shown in line 550 of block 540, the system operates in the very slow mode with ADJ2, ADJ1, and ADJ0 defined by register 425 and shown in line 520 of block 510.

Thus, the disclosed invention may put a SRAM into a mode where tighter timings are used during test to find weak cells. Those weak cells, which show up as a fail at the tightened timings, may then be repaired. When the SRAM is run in functional (customer) mode, normal timings may be applied to only robust cells. The BIST may control what set of timings the SRAM uses. Each SRAM or SRAM family may be independently controlled to allow flexibility for different memory architectures.

Each SRAM may have eight timing modes: functional, very slow, three versions of tighten, and three versions of relax. The BIST may implement among four for each SRAM or SRAM family: functional, very slow, one of the tightens, and one of the relaxations. Logic in the BIST (TESTM1 and TESTM3) signals may guarantee that the SRAM will always use functional timings in the functional mode.

The architecture and methods allow for other uses. The very slow mode may be used for testing where timing is not important; that is, only for data integrity (for example, burn-in mode). The relaxed timing may be used to allow characterization to continue on hardware that is marginal. The various tighten and relaxation modes may allow for characterization to find the "cliff" where cells start to fail. Future designs can then use that data to re-enter the timings accordingly.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention.

What is claimed:

1. A method of manufacturing a device having embedded memory including a plurality of memory cells, the method comprising the steps of:
   applying a first test stress to selected cells of the plurality of memory cells with a built-in self test by performing a plurality of test sequences, wherein each of said test sequences includes a test pattern used with a set of conditions and the set of conditions are different between each of said test sequences;
   identifying at least one weak memory cell;
   repairing the at least one weak memory cell; and
   applying a second test stress to the selected cells and the repaired cells with the built-in self test, the second test stress being different from the first test stress.

2. The method of claim 1, wherein the step of applying a first test stress further comprises the step of operating the memory cells with a timing that exceeds an operational timing.

3. The method of claim 1, wherein the step of applying a second test stress includes the step of applying an operational timing.

4. The method of claim 1, further comprising the step of applying the second test stress by performing a plurality of test sequences, wherein each of said test sequences includes a test pattern used with a set of conditions and the set of conditions are different between each of said test sequences.

5. The method of claim 1, wherein the step of applying a first test stress includes the step of operating each memory cell with at least one tight timing, the at least one tight timing being less than an operational timing.

6. The method of claim 1, further comprising the step of:
   rejecting the embedded memory when at least one failed memory cell is identified from the applied second test stress.

7. The method of claim 1, wherein the step of applying the first test stress further comprises the step of operating the memory cells with a first timing that is outside of a predetermined timing value and the step of applying the second test stress further comprises the step of operating the memory cells with a second timing that is different from the first timing.

8. A method for testing during manufacturing a device having embedded memory including a plurality of memory cells, the method comprising the steps of:
   applying a first set of timings to selected cells of the plurality of memory cells using built-in self test controls;
   testing the selected cells using the first set of timings in a set of test sequences, wherein each of said test sequences includes a test pattern used with a set of conditions and the plurality of conditions are different between each of said test sequences;
   identifying weak memory cells;
   repairing the weak memory cells;
   applying a second set of timings different from the first set of timings to the selected cells and the repaired cells using the built-in self test controls; and
   testing the selected cells and the repaired cells using the second set of timings.

9. The method of claim 8, wherein the first set of timings provides at least a first stress to the cells and the second set of timings provides at least a second stress to the cells.

10. The method of claim 9, wherein the second set of timings tests the memory cells an operational timing.

11. The method of claim 9, wherein the first set of timings tests the memory cells at timings that are faster than an operational timing.

12. The method of claim 9, wherein the at least the first stress includes two or more stresses and the at least the second stress includes two or more further stresses, the method further comprising the steps of using the first set of timings to provide the two or more stresses to the cells and using the second set of timings to provide the two or more further stresses to the cells.

13. The method of claim 8, further comprising the step of:
   rejecting the embedded memory when at least one failed memory cell is Identified from the second set of timings.

14. A method of manufacturing a device having embedded memory including a plurality of memory cells, the method comprising the steps of:
   (a) providing a first plurality of timings and a second plurality of timings to built-in self test controls, the first plurality of timings being different from the second plurality of timings;
   (b) applying at least one of the first plurality of timings to selected cells using the built-in self test controls by performing a plurality of test sequences, wherein each of said test sequences includes a test pattern used with a set of conditions and the set of conditions are different between each of said test sequences;
   (c) identifying failed memory cells;
   (d) repairing the failed memory cells; and
   (e) repeating steps (b) to (d) by applying additional selected ones of the first plurality of timings to the cells.

15. The method of claim 14 further comprising the step of (f) applying at least one of the second plurality of timings to each of the cells using the built-in self test controls.

16. The method of claim 15 further comprising the step of (g) repeating step (f) by applying additional selected ones of the second plurality of timings to each of the cells.

17. The method of claim 15, step (f) further comprising:
   rejecting the embedded memory when one or more further failed memory cells are identified from the applied at least one of the second plurality or timings.

18. A device for testing an embedded memory having a plurality of memory cells during manufacture of the embedded memory, the device comprising:
   a first delay circuit comprising:
   a first timer for applying a plurality of timings to the memory cells, the plurality of timings including an operational timing mode at a predetermined level, a plurality of relaxed timing modes that exceeds the predetermined timing level and a plurality of tightened timing modes that is less than the predetermined timing level, and
   a second timer for modifying at least one of the plurality of timings;
   a second delay circuit coupled to the first delay circuit for modifying at least one of the plurality of timings to provide a timing that exceeds the plurality of relaxed timing modes; and
   a logic circuit for testing the memory cells by applying the at least one of the plurality of timings to the memory cells.

19. The device of claim 18, further comprising a sensor coupled to the memory cells for determining whether the memory cells failed the testing; and a repair component for repairing failed cells.

20. The device of claim 18, wherein the first and second timers are located in at least one area of the embedded memory.

21. The device of claim 18, wherein the embedded memory includes a built-in self test for controlling the testing for determining whether any memory cells failed the testing.

22. The device of claim 21, wherein the embedded memory includes a built-in self repair for repairing failed memory cells

* * * * *